(12) United States Patent
Nemeth

(10) Patent No.: US 11,593,576 B1
(45) Date of Patent: Feb. 28, 2023

(54) SCRATCH-OFF DESIGN FOR TAMPER IDENTIFICATION

(71) Applicant: Touchcode Holdings, LLC, New York, NY (US)

(72) Inventor: Wayne L. Nemeth, Rye, NY (US)

(73) Assignee: Touchcode Holdings, LLC, New York, NY (US)

(*) Notice: Subject to any disclaimer, the term of this patent is extended or adjusted under 35 U.S.C. 154(b) by 0 days.

(21) Appl. No.: 16/439,059

(22) Filed: Jun. 12, 2019

Related U.S. Application Data

(60) Provisional application No. 62/684,148, filed on Jun. 12, 2018.

(51) Int. Cl.
| | |
|---|---|
| *G06K 7/10* | (2006.01) |
| *H05K 3/10* | (2006.01) |
| *H05K 1/02* | (2006.01) |
| *H05K 3/22* | (2006.01) |

(52) U.S. Cl.
CPC ....... *G06K 7/10366* (2013.01); *H05K 1/0268* (2013.01); *H05K 3/10* (2013.01); *H05K 3/22* (2013.01); *H05K 2201/09936* (2013.01)

(58) Field of Classification Search
CPC ............ G06K 7/081; G06K 19/06187; G06K 19/06196; G06K 19/067; C09D 11/52
See application file for complete search history.

(56) References Cited

U.S. PATENT DOCUMENTS

| | | | | |
|---|---|---|---|---|
| 6,875,105 | B1* | 4/2005 | Behm | A63F 3/0665 |
| | | | | 235/375 |
| 7,455,323 | B2* | 11/2008 | Taylor | G09B 19/00 |
| | | | | 283/101 |
| 2004/0150220 | A1* | 8/2004 | Holmes | G06K 19/16 |
| | | | | 283/110 |
| 2005/0140091 | A1* | 6/2005 | Brickwood | A63F 3/0665 |
| | | | | 273/269 |
| 2014/0145426 | A1* | 5/2014 | Lettow | B82Y 30/00 |
| | | | | 283/85 |
| 2018/0129832 | A1* | 5/2018 | Keller | G06K 7/081 |

* cited by examiner

*Primary Examiner* — Thien M Le
*Assistant Examiner* — April A Taylor
(74) *Attorney, Agent, or Firm* — Wolf, Greenfield & Sacks, P.C.

(57) ABSTRACT

An article is described herein which comprises a substrate, a character sequence disposed on the substrate, a scratch-off coating disposed at least in part over at least one portion of the character sequence, and at least one conductive trace disposed at least in part over the at least one portion of the character sequence.

6 Claims, 1 Drawing Sheet

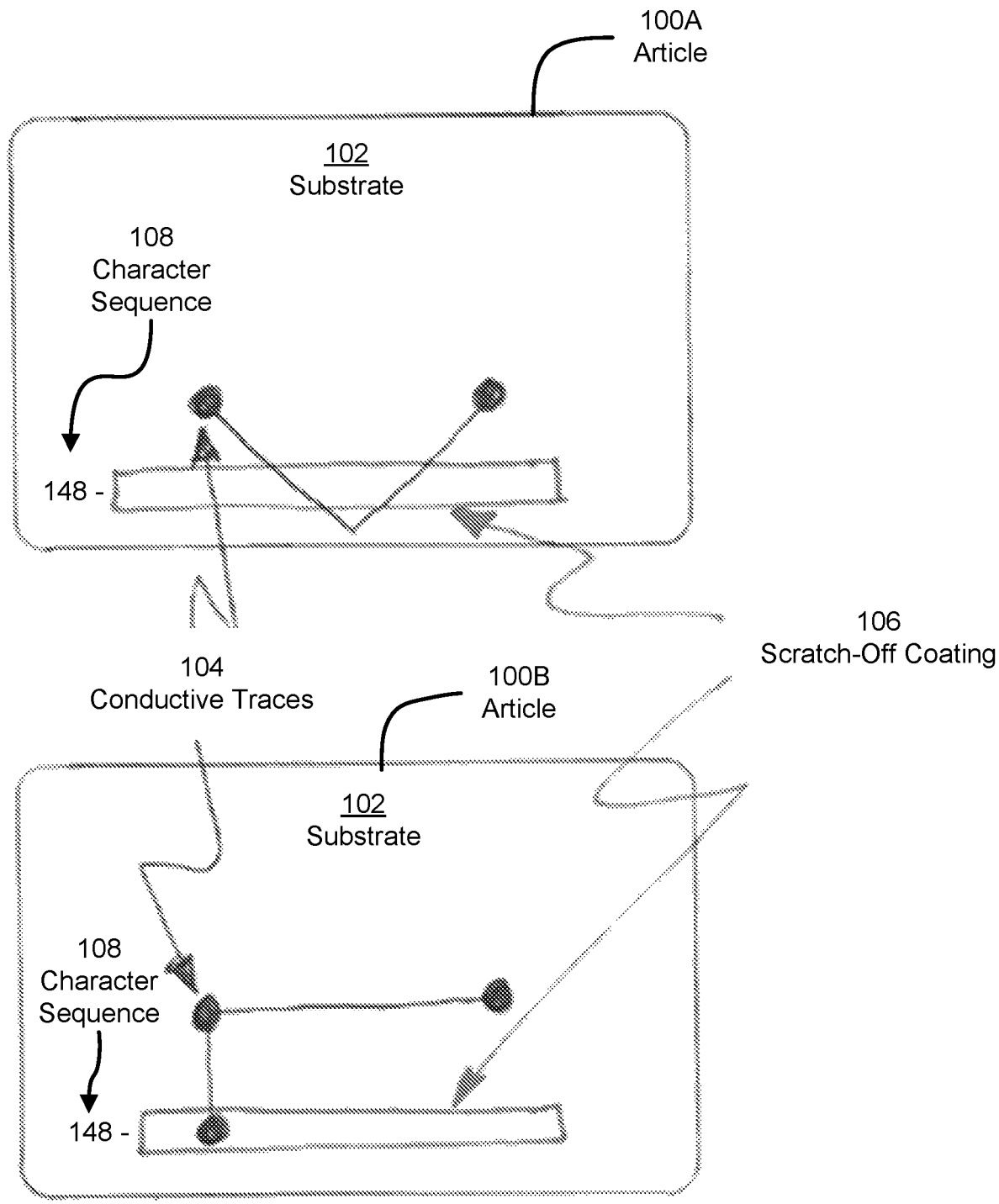

SCRATCH-OFF DESIGN FOR TAMPER IDENTIFICATION

RELATED APPLICATIONS

This application claims priority to U.S. Provisional Application No. 62/684,148, filed Jun. 12, 2018, which is incorporated herein by reference in its entirety.

BACKGROUND

Scratch-off coatings are sometimes used to hide codes, or portions of codes, that can be used to identify accounts, cards, prizes or other items. Manufacturers, suppliers, and distributers hide the identity of these codes to allow only the end-user (e.g., customer) to possess the entire code. Thus, the code may be protected from theft throughout the supply chain including a retail environment. In the case of gift cards, the code may be used to redeem card value online and/or in-store where codes are readable using a device such as bar code scanner.

SUMMARY

According to at least one aspect, an article is provided. The article comprises a substrate, a character sequence disposed on the substrate, a scratch-off coating disposed at least in part over at least one portion of the character sequence, and at least one conductive trace disposed at least in part over the at least one portion of the character sequence.

In some embodiments, the character sequence comprises at least one member selected from the group consisting of: a letter, a number, and a punctuation mark.

In some embodiments, the substrate is constructed at least in part from a thermoplastic.

In some embodiments, the scratch-off coating is disposed over at least a portion of the at least one conductive trace.

In some embodiments, at least part of the at least one conductive trace is integrated with the scratch-off coating.

In some embodiments, the scratch-off coating is disposed below at least a portion of the at least one conductive trace.

In some embodiments, the at least one conductive trace defines a capacitive code configured to be read by a capacitive sensor.

In some embodiments, the article is a tamper-resistant card. In some embodiments, the article is a tamper-resistant gift card.

According to at least one aspect, a method of manufacturing an article is provided. The method comprises receiving a substrate, depositing a character sequence on the substrate, depositing at least one conductive trace at least in part over at least one portion of the character sequence, and depositing a scratch-off coating at least in part over the at least one portion of the character sequence.

In some embodiments, depositing the at least one conductive trace comprises depositing the at least one conductive trace before depositing the scratch-off coating.

In some embodiments, depositing the at least one conductive trace comprises depositing the at least one conductive trace after depositing the scratch-off coating.

In some embodiments, at least a portion of the at least one conductive trace is integrated with the scratch-off coating and wherein depositing the at least one conductive trace comprises depositing the at least one conductive trace at least partially in parallel with depositing the scratch-off coating.

According to at least one aspect, a method of determining whether a scratch-off coating has been replaced is provided. The method comprises receiving an article comprising a substrate, a scratch-off coating disposed over the substrate, and at least one conductive trace disposed in a pattern over the substrate, detecting, using at least one capacitive sensor, information indicative of the pattern of the at least one conductive trace, and determining, using at least one processor communicatively coupled to the at least one capacitive sensor, whether the scratch-off coating has been replaced using the information indicative of the pattern of the at least one conductive trace.

In some embodiments, determining whether the scratch-off coating has been replaced comprising comparing the information indicative of the pattern of the at least one conductive trace with at least one template. In some embodiments, determining whether the scratch-off coating has been replaced comprises: determining that the scratch-off coating has not been replaced when the information indicative of the pattern of the at least one conductive trace matches the at least one template; and determining that the scratch-off coating has been replaced when the information indicative of the pattern of the at least one conductive trace does not match the at least one template.

BRIEF DESCRIPTION OF THE DRAWINGS

The accompanying drawings are not intended to be drawn to scale. In the drawings, each identical or nearly identical component that is illustrated in various figures may be represented by a like numeral. For purposes of clarity, not every component may be labeled in every drawing. In the drawings:

FIG. 1 is a diagram of example tamper-resistant articles, according to certain embodiments.

DETAILED DESCRIPTION

As mentioned above, scratch-off coatings may be used to hide codes on articles (e.g., cards such as gift cards) to protect the code in the supply chain of the article before the article reaches the end-user. The inventors have appreciated that these scratch-off coatings are susceptible to tampering. In particular, the advent of readily accessible materials and techniques to replace scratch-off coatings has made these scratch-off coatings easy to circumvent. For example, a wrong-doer may purchase a packet of peel and stick scratch-off coatings from a retailer, remove the scratch-off coating from a gift card to expose the entire gift code, record the entire gift code, and apply one of the peel and stick scratch-off coatings from the packet onto the gift card. The tampered gift card may be visually identical to an untampered gift card and, thus, may be returned into the supply chain without being detected. As a result, an end-user may add money onto the gift card and the wrong-doer may, in turn, make online purchase(s) using the recorded gift code before the end-user has a chance to spend the money on the gift card.

Accordingly, aspects of the present disclosure relate to new techniques to quickly and easily determine whether a scratch-off coating has been inappropriately modified. In some embodiments, conductive traces may be integrated into the article at a location that, at least in part, passes under, over, or through the scratch-off coating. Such conductive traces may contain or constitute a capacitive code capable of being read by a capacitive sensor including, for example, a capacitive touch screen, such as the capacitive touch screen integrated into smart phones and/or tablets. The conductive traces may be invisible to the naked eye and exhibit conductive characteristics that are significantly more difficult to reproduce than the scratch-off coating alone. Thus, the conductive traces are difficult for a potential wrong-doer to identify and accurately reproduce. In the event the scratch-off coating is removed, at least some of the conductive traces would be scratched-off, damaged or otherwise modified. As a result, the conductive characteristics (e.g., capacitance) of the conductive traces would be changed. Such a change in the conductive characteristic may be readily identified by a capacitive sensor.

FIG. 1 is a diagram of example tamper-resistant articles 100A and 100B, according to some embodiments. The tamper-resistant articles 100A and/or 100B may be implemented as, for example, tamper-resistant cards such as tamper-resistant gift cards. As shown, each of the articles 100A and 100B includes a substrate 102, conductive traces 104 that may define a capacitive code, a scratch-off coating 106, and a character sequence 108.

The substrate 102 may be a structural component of the card onto which other materials may be applied. The substrate 102 may be constructed from any of a variety of materials including, for example, a plastic such as a thermoplastic. Example thermoplastics include polyvinyl chloride acetate (PVCA), acrylonitrile butadiene styrene (ABS), and polycarbonate (PC). The particular dimensions of the substrate 102 may vary based on the particular implementation. In some embodiments, the substrate 102 may have the dimensions of a typical credit card. For example, the substrate 102 may have a width between 80 millimeters (mm) and 90 mm, a length between 45 mm and 60 mm, and a height between 0.5 mm and 1.5 mm.

The character sequence 108 may be a sequence of characters including, for example, letters, numbers, and/or punctuation marks (e.g., periods, commas, hyphens, exclamation points, question marks, etc.). The character sequence 108 may be, for example, a sequence of numbers employed by an end user to use the card (e.g., to complete a purchase). For illustration, the character sequence 108 may be a gift code used to redeem products and/or services from a company and/or a security code used to complete purchase using the article. The character sequence 108 may be disposed over the substrate 102 using any of a variety of techniques. For example, the character sequence 108 may be directly printed onto the substrate 102 or printed onto one or more other materials that are, in turn, deposited on the substrate 102.

The conductive traces 104 may be deposited on the substrate 102 and define a code (e.g., a capacitive code) that may be read by a capacitive sensor (e.g., a touch screen in a smart phone). Any suitable technique or combination of techniques may be used to form the conductive traces 104, including, but not limited to, depositing (e.g., printing) conductive ink. The particular capacitive code defined by the conductive traces 104 may be determined based on the pattern of the conductive traces on the substrate 102. The pattern of the conductive traces 104 may be configured to interact with a capacitive sensor and thereby cause the capacitive sensor to generate a signal.

As shown in cards 100A and 100B, the conductive traces 104 may comprise a plurality of nodes (shown as circular regions) that may be connected by one or more interconnects (shown as lines between the circular regions). The particular number, placement, shape, and arrangement of nodes and/or interconnects may define a particular code. For example, the code formed by the set of two nodes and interconnect in card 100A may be different from the code formed by the set of three nodes and interconnects in card 100B.

In some embodiments, at least a portion of the conductive traces 104 may disposed over the character sequence 108. For example, at least a portion of the conductive traces 104 (e.g., a node and/or an interconnect) may pass through the region of the character sequence 108 that is obscured by the scratch-off coating 106. Thus, removal of the scratch-off coating 106 may modify one or more nodes and/or interconnects in the conductive traces 104. As a result, the capacitive code on the article is changed when the scratch-off coating 106 is removed, which may be detected by a capacitive sensor. Thus, a capacitive sensor may be able to detect whether the article has been tampered with. It should be appreciated that the conductive traces 104 may be disposed in any of a variety of positions relative to the scratch-off coating 106. For example, the conductive traces 104 may be disposed under the scratch-off coating 106, above the scratch-off coating 106, and/or at least in part integrated with the scratch-off coating 106.

Example capacitive codes and methods of detection thereof are described in the following issued patents and patent publications which are each incorporated by reference in their entireties: U.S. Pat. No. 8,497,850, titled "SYSTEM AND METHOD FOR RETRIEVING INFORMATION FROM AN INFORMATION CARRIER BY MEANS OF CAPACITIVE TOUCH SCREEN," issued on Jul. 30, 2013; U.S. Pat. No. 8,622,307, titled "IDENTIFICATION SYSTEM AND APPLICATIONS," issued on Jan. 7, 2014; U.S. Patent Publication No. 2012/0125993, titled "PLANAR DATA CARRIER," published on May 24, 2014; U.S. Patent Publication 2013/0115878, titled "SYSTEM COMPRISING A CAPACITIVE INFORMATION CARRIER FOR ACQUIRING INFORMATION," published on May 9, 2013; U.S. Patent Publication No. 2013/0284578, "INFORMATION CARRIER AND SYSTEM FOR ACQUIRING INFORMATION," published Oct. 31, 2013; and U.S. Patent Publication No. 2014/0354594, titled TOUCH-SENSITIVE DATA CARRIER AND METHOD," published Dec. 4, 2014.

The scratch-off coating 106 may be an opaque coating that is applied over at least some of the character sequence 108. Thus, at least part of the character sequence 108 may be obscured from view. The scratch-off coating 106 may be removed from the card by rubbing with a coin, fingernail, or other object. Any suitable technique or combination of techniques may be used to form the scratch-off coating 106, including, but not limited to, depositing (e.g., printing) ink.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed.

The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

When the word "about" is used herein in reference to a number, it should be understood that still another embodiment of the invention includes that number not modified by the presence of the word "about."

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. An article, comprising:
    a substrate;
    a character sequence disposed on the substrate;
    a scratch-off coating disposed at least in part over at least one portion of the character sequence; and
    at least one conductive trace disposed at least in part over the at least one portion of the character sequence, wherein at least part of the at least one conductive trace is integrated with the scratch-off coating such that the conductive traces pass through the scratch-off coating.

2. The article of claim 1, wherein the character sequence comprises at least one member selected from the group consisting of: a letter, a number, and a punctuation mark.

3. The article of claim 1, wherein the substrate is constructed at least in part from a thermoplastic.

4. The article of claim 1, wherein the at least one conductive trace defines a capacitive code configured to be read by a capacitive sensor.

5. The article of claim 1, wherein the article is a tamper-resistant card.

6. The article of claim 5, wherein the article is a tamper-resistant gift card.

* * * * *